United States Patent
Wang

(10) Patent No.: US 10,945,348 B2
(45) Date of Patent: Mar. 9, 2021

(54) QUICK RELEASE CONNECTING DEVICE

(71) Applicant: Ting-Jui Wang, New Taipei (TW)

(72) Inventor: Ting-Jui Wang, New Taipei (TW)

(*) Notice: Subject to any disclaimer, the term of this patent is extended or adjusted under 35 U.S.C. 154(b) by 445 days.

(21) Appl. No.: 15/809,271

(22) Filed: Nov. 10, 2017

(65) Prior Publication Data
US 2018/0092234 A1    Mar. 29, 2018

Related U.S. Application Data

(62) Division of application No. 14/553,176, filed on Nov. 25, 2014, now abandoned.

(51) Int. Cl.
*H05K 7/14*    (2006.01)

(52) U.S. Cl.
CPC ................. *H05K 7/1409* (2013.01)

(58) Field of Classification Search
CPC ...... H05K 5/0221; H05K 7/14; H05K 7/1409; H05K 7/1405; H05K 7/1402
See application file for complete search history.

(56) References Cited

U.S. PATENT DOCUMENTS

| | | | | |
|---|---|---|---|---|
| 4,699,594 A * | 10/1987 | Assel | ................... | H05K 7/1409 439/152 |
| 4,975,073 A * | 12/1990 | Weisman | ............. | H05K 7/1409 439/153 |
| 5,793,614 A * | 8/1998 | Tollbom | ............... | H05K 7/1409 361/725 |
| 6,269,007 B1 * | 7/2001 | Pongracz | ............. | H05K 7/1409 211/41.17 |
| 6,381,146 B1 * | 4/2002 | Sevier | .................. | H05K 7/1409 200/51 R |
| 6,388,884 B1 * | 5/2002 | Greco | ...................... | H01H 9/20 200/50.02 |
| 6,916,190 B2 * | 7/2005 | Joist | ...................... | H05K 7/1409 361/732 |
| 7,172,441 B2 * | 2/2007 | Schlack | ............... | H01R 13/633 439/152 |

(Continued)

FOREIGN PATENT DOCUMENTS

| | | | | |
|---|---|---|---|---|
| CN | 201162743 Y | | 12/2008 | |
| DE | 44 28 529 | * | 8/1995 | ............... H05K 7/14 |
| JP | H1125941 A | | 1/1999 | |

*Primary Examiner* — Michael P Ferguson
(74) *Attorney, Agent, or Firm* — Schmeiser, Olsen & Watts, LLP

(57) ABSTRACT

A quick release connecting device includes an actuating retainer having an internal receiving space, at least one first push section and a retaining section for detachably engaging with a first object; a fixing member including a body portion movably associated with the receiving space and a pivot portion formed on the body portion for detachably connecting with a second object; pin connection means connecting the body portion to the receiving space for the actuating retainer and the fixing member to move relative to each other within a limited range; an elastic element having two ends pressed against an inner wall surface of the receiving space and the body portion to control the limited movement of the actuating retainer and the fixing member and return them to their original positions. With the quick release connecting device, two mating objects can be conveniently repeatedly connected to and separated from each other.

1 Claim, 11 Drawing Sheets

(56) References Cited

U.S. PATENT DOCUMENTS

| | | | |
|---|---|---|---|
| 7,203,067 B2* | 4/2007 | Beall | H05K 7/1409 |
| | | | 361/726 |
| 7,284,997 B2 | 10/2007 | Joist | |
| 7,292,457 B2* | 11/2007 | DeNies | H05K 7/1461 |
| | | | 361/759 |
| 7,658,569 B2 | 2/2010 | de Oliveira | |
| 7,749,006 B2* | 7/2010 | Chiang | H05K 7/1409 |
| | | | 439/160 |
| 8,369,094 B2* | 2/2013 | McLean | H05K 7/1409 |
| | | | 361/747 |
| 9,295,178 B1* | 3/2016 | Aldea | F16B 2/10 |
| 10,686,268 B2* | 6/2020 | Wang | H01R 12/7058 |
| 2004/0192095 A1 | 9/2004 | Joist | |

* cited by examiner

QUICK RELEASE CONNECTING DEVICE

CROSS-REFERENCE TO RELATED APPLICATION

This application is a divisional patent application of U.S. application Ser. No. 14/553,176 filed on Nov. 25, 2014, the entire contents of which are hereby incorporated by reference for which priority is claimed under 35 U.S.C. § 120.

FIELD OF THE INVENTION

The present invention relates to a quick release connecting device, and more particularly to a quick release connecting device that enables convenient and repeated assembling and separation of a circuit board, a drawer, or a window to and from a corresponding rack, chassis, cabinet or window frame.

BACKGROUND OF THE INVENTION

To enable convenient assembling and fastening of a circuit board to a rack, and to enable easy disassembling of the circuit board from the rack when necessary, a quick release mechanism is usually provided on the circuit board or the rack. Various types of quick release mechanisms are known, and each type of circuit board has a corresponding quick release mechanism designed for it. To enable two mating objects, such as the circuit board and the rack, to be repeatedly assembled to and separated from each other in a quick and convenient manner, it is desirable to develop an improved quick release connecting device that includes means to assist in pushing away a first one of the two mating objects, so that the second object can be easily pulled out of the first object.

SUMMARY OF THE INVENTION

In view that the prior art quick release mechanisms are not perfect for use, it is tried by the inventor to develop an improved quick release connecting device to enable convenient and repeated assembling and separation of a circuit board, a drawer, a window, etc. to and from a corresponding rack, chassis, cabinet, window frame, etc.

A primary object of the present invention is to provide a quick release connecting device that includes an actuating retainer and a fixing member limitedly movably assembled to each other, so that a second object, such as a circuit board, a drawer or a window, detachably connected to a first object, such as a rack, a chassis, a cabinet or a window frame, via the actuating retainer and the fixing member can be conveniently and repeatedly assembled to and separated from each other.

To achieve the above and other objects, the quick release connecting device according to a preferred embodiment of the present invention includes an actuating retainer having an internal receiving space and a retaining section for detachably engaging with a first object; a fixing member including a body portion movably associated with the receiving space and a pivot portion formed on the body portion for detachably connecting with a second object; pin connection means connecting the body portion to the receiving space for the actuating retainer and the fixing member to move relative to each other within a limited range; and an elastic element disposed in the receiving space with two ends pressed against an inner wall surface of the receiving space and the body portion to control the limited movement of the actuating retainer and the fixing member and return them to their original positions.

In an operable embodiment of the quick release connecting device according to the present invention, the fixing member includes a hand push section formed on the body portion.

In an embodiment of the quick release connecting device of the present invention, the actuating retainer and the fixing member connected to each other via the pin connection means are slidable relative to each other within a limited range.

In the above embodiment of the quick release connecting device of the present invention, the actuating retainer includes a pin connection slot communicating with the receiving space, and the pin connection means is located in the pin connection slot.

In an operable embodiment of the quick release connecting device of the present invention, the pin connection slot is a long slide slot formed on one or two lateral walls of the receiving space; and the pin connection means is slidable in the long slide slot to thereby bring the actuating retainer and the fixing member to slide relative to each other within a limited range.

In another embodiment of the quick release connecting device of the present invention, the body portion of the fixing member includes a long slide hole communicable with the receiving space; and the pin connection means is slidable in the long slide hole to thereby bring the actuating retainer and the fixing member to slide relative to each other within a limited range.

In an embodiment of the quick release connecting device of the present invention, the actuating retainer and the fixing member connected to each other via the pin connection means are rotatable relative to each other within a limited angle.

In the above embodiment of the quick release connecting device of the present invention, the actuating retainer includes a pin connection slot communicating with the receiving space, and the pin connection means is located in the pin connection slot.

In an operable embodiment of the quick release connecting device of the present invention, the pin connection slot is a locating hole formed on one or two lateral walls of the receiving space; and the pin connection means is rotatable in the locating hole to thereby bring the actuating retainer and the fixing member to rotate relative to each other within a limited angle.

In an embodiment of the quick release connecting device of the present invention, the pin connection means includes a cylindrical pin integrally formed with or additionally assembled to the body portion of the fixing member.

In the above embodiment of the quick release connecting device of the present invention, the pin connection means further includes a pin holding hole formed on the body portion of the fixing member; and the cylindrical pin is inserted in, riveted to, expansion-fitted in, glued to or screwed into the pin holding hole.

In an embodiment of the quick release connecting device of the present invention, the pin connection means includes a cylindrical pin integrally formed with or additionally assembled to the actuating retainer.

In the above embodiment of the quick release connecting device of the present invention, the pin connection means further includes a pin holding hole formed on the actuating retainer; and the cylindrical pin is inserted in, riveted to, expansion-fitted in, glued to or screwed into the pin holding hole.

In another embodiment of the quick release connecting device of the present invention, the pin connection means includes a cylindrical pin integrally formed with or additionally assembled to the actuating retainer; and the cylindrical pin is transversely extended through the receiving space.

In the above embodiment of the quick release connecting device of the present invention, the pin connection means further includes at least one pin holding hole formed on the actuating retainer to communicate with the receiving space; and the cylindrical pin is inserted in, riveted to, expansion-fitted in, glued to or screwed into the pin holding hole.

In an embodiment of the quick release connecting device of the present invention, the retaining section on the actuating retainer is a hook directed leftward or rightward relative to the actuating retainer.

In the above embodiment of the quick release connecting device of the present invention, the hook includes a beveled guide surface and a hooking surface connected to a lower edge of the beveled guide surface.

In an embodiment of the quick release connecting device of the present invention, the actuating retainer includes at least one first push section.

In an embodiment of the quick release connecting device of the present invention, the fixing member includes at least one second push section.

In an embodiment of the quick release connecting device of the present invention, the receiving space includes a slide space, and the body portion of the fixing member is movable in the slide space.

In an embodiment of the quick release connecting device of the present invention, the elastic element is a coil spring, a spring plate or an elastic bar.

In an embodiment of the quick release connecting device of the present invention, the pivot portion of the fixing member can be one of a protruded block, a retaining block and a through hole integrally formed with or additionally assembled to the body portion.

In an embodiment of the quick release connecting device of the present invention, the pivot portion is inserted in, snapped fitted onto, riveted to, expansion-fitted onto or screwed to the second object to be movably connected to the second object.

In the quick release connecting device of the present invention, the actuating retainer and the fixing member are made of a material selected from the group consisting of a plastic material and a metal material.

To use the quick release connecting device of the present invention, first movably connect the pivot portion of the fixing member to the second object, such as a circuit board, a drawer or a window. Since the actuating retainer and the fixing member are movably assembled to each other, at least one of them can be quickly detachably engaged with at least a first object, such as a chassis, a rack, a cabinet or a window frame. More specifically, the retaining section of the actuating retainer and/or the second push section of the fixing member can be quickly detachably engaged with the first object to thereby quickly connect the second object to the first object. On the other hand, to separate the second object from the first object, simply push the first push section for the retaining section to disengage from the first object and pivotally turn the fixing member for the second push section to push away the first object, and the second object is easily separated from the first object. Therefore, with the quick release connecting device of the present invention, the second object can be repeatedly quickly assembled to and separated from the first object.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
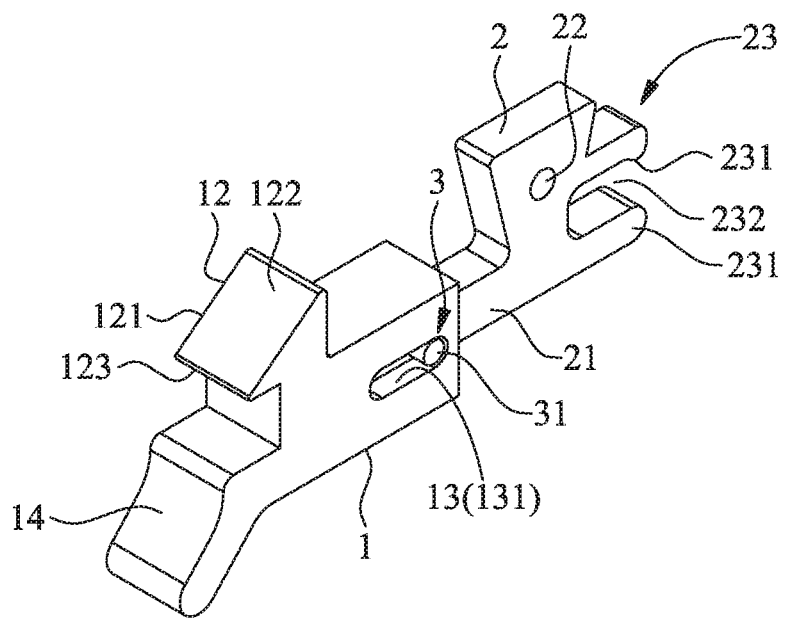
FIG. 1 is an assembled perspective view of a quick release connecting device according to a first preferred embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 10:
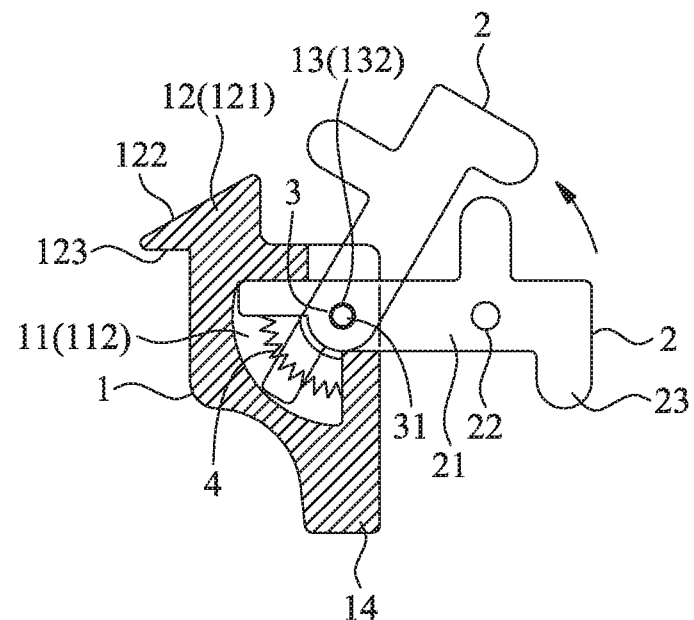
FIG. 10 is an assembled partially sectioned front view of a quick release connecting device according to a second preferred embodiment of the present invention.
Figure 11:
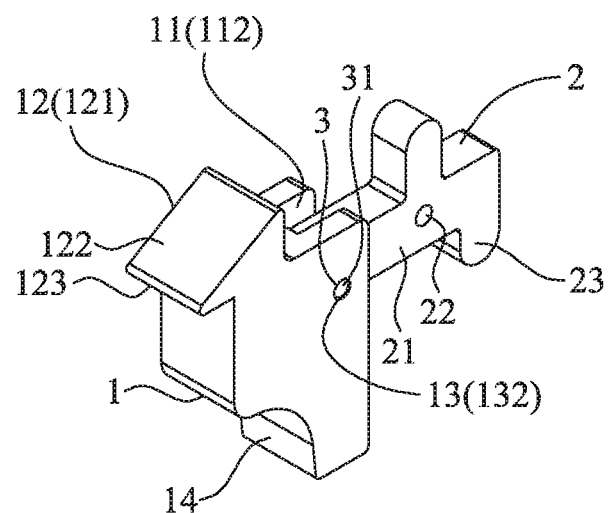
FIG. 11 is an assembled perspective view of the quick release connecting device according to the second preferred embodiment of the present invention.
Figure 12:
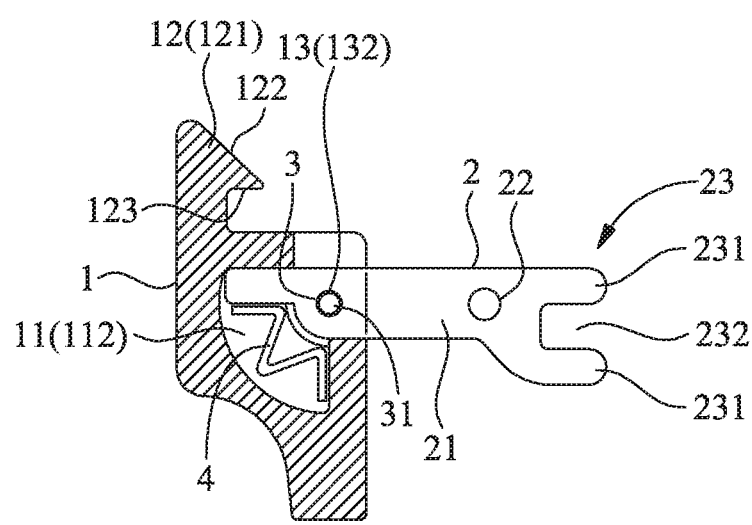
FIG. 12 is an assembled partially sectioned front view of a variant of the second preferred embodiment of the present invention, showing an elastic plate and a different retaining section are included in the quick release connecting device.
Figure 13A:
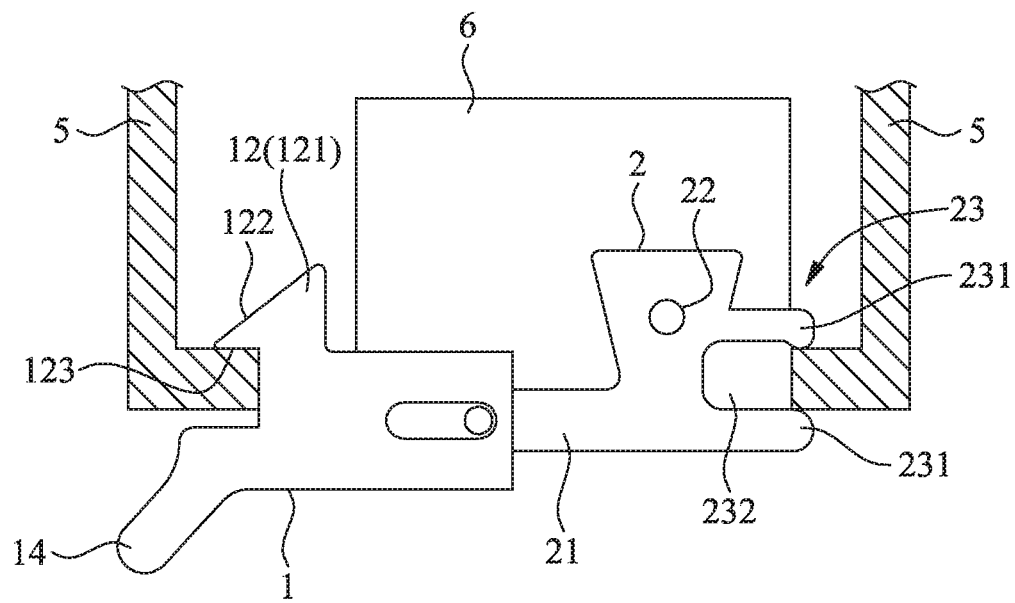
FIG. 13A shows the quick release connecting device according to the first preferred embodiment of the present invention is connected to two objects and can be operated to quickly release the two objects from each other.
Figure 13B:
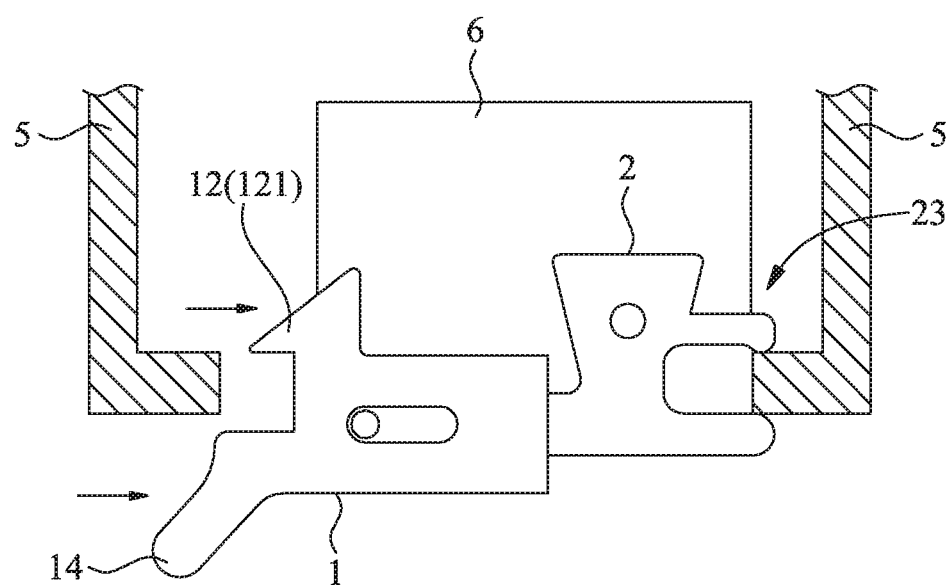
FIG. 13B shows the quick release connecting device according to the first preferred embodiment of the present invention is connected to two objects and can be operated to quickly release the two objects from each other.

FIGS. 1 to 9 show a quick release connecting device according to a first preferred embodiment of the present invention, which is configured to enable limited slide, i.e. to slide within a limited range; and FIGS. 10 to 12 show a quick release connecting device according to a second preferred embodiment of the present invention, which is configured to enable limited rotation, i.e. to rotate within a limited angle. As shown, in both of the first and second preferred embodiments, the quick release connecting device of the present invention includes an actuating retainer 1 and a fixing member 2 movably assembled to the actuating retainer 1. The actuating retainer 1 can be made of a plastic material or a metal material; it internally defines a receiving space 11 and includes a retaining section 12 for detachably engaging with a first object 5 and at least one first push section 14. The fixing member 2 can be made of a plastic material or a metal material; it includes a body portion 21 and a pivot portion 22 formed on an outer end of the body portion 21. The body portion 21 has an inner end movably associated with the receiving space 11 of the actuating retainer 1; and the pivot portion 22 is located outside the receiving space 11 for detachably connecting with a second object 6. The first push section 14 can be a protrusion outward projected from any side of the actuating retainer 1. As shown in FIG. 13B, by applying a force against the first push section 14, the actuating retainer 1 can be moved to release the retaining section 12 from the first object 5, allowing the second object 6 to separate from the first object 5. The quick release connecting device of the present invention further includes pin connection means 3 and an elastic element 4. The pin connection means 3 enables connection of the body portion 21 of the fixing member 2 to the receiving space 11 of the actuating retainer 1, such that the actuating retainer 1 and the fixing member 2 in the first and the second preferred embodiment are slidable and rotatable, respectively, relative to each other within a limited range and angle. The elastic element 4 is disposed in the receiving space 11 of the actuating retainer 1, or can be disposed at a selected position, with an end pressed against an inner wall surface of the receiving space 11 and another opposite end against the body portion 21 of the fixing member 2. The elastic element 4 enables and controls limited sliding or rotation of the actuating retainer 1 and the fixing member 2 relative to each other, and can elastically push the actuating retainer 1 and the fixing member 2 back to their original positions.

Figure 5:
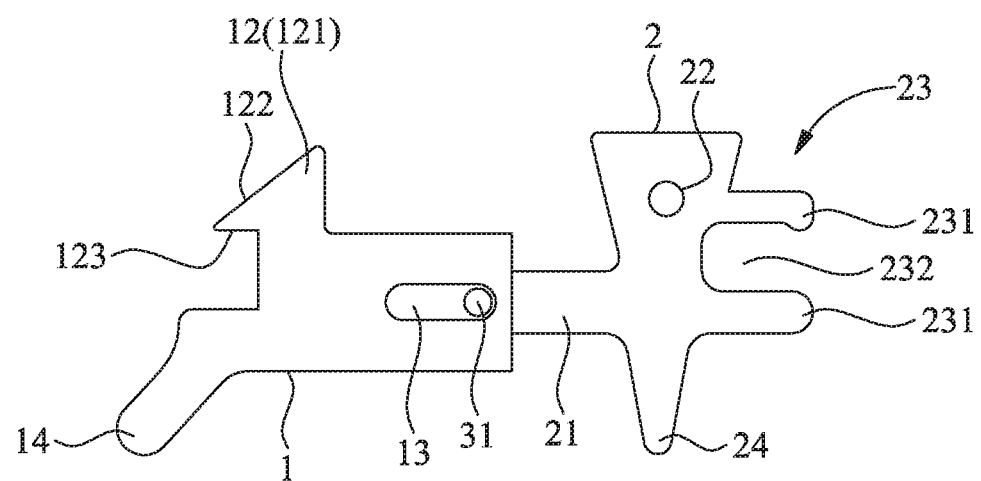
FIG. 5 is an assembled front view of a first variant of the quick release connecting device according to the first preferred embodiment of the present invention, showing it further includes a hand push section.

Please refer to FIG. 5 that is an assembled front view showing a first variant of the first preferred embodiment of the present invention further includes a hand push section 24 provided on the body portion 21 of the fixing member 2. The hand push section 24 can be a protrusion downward projected from a lower side of the body portion 21. The hand push section 24 and the first push section 14 are preferably directed to the same direction. In FIG. 5, the hand push section 24 and the first push section 14 are illustrated as directing downward. With this arrangement, a user may conveniently move the actuating retainer 1 toward the fixing member 2 by pressing one finger, such as the thumb, against an axially outer side (i.e. the left side in the drawing) of the first push section 14 while pressing another finger, such as the index finger, against an axially outer side (i.e. the right side in the drawing) of the hand push section 24.

Figure 6:
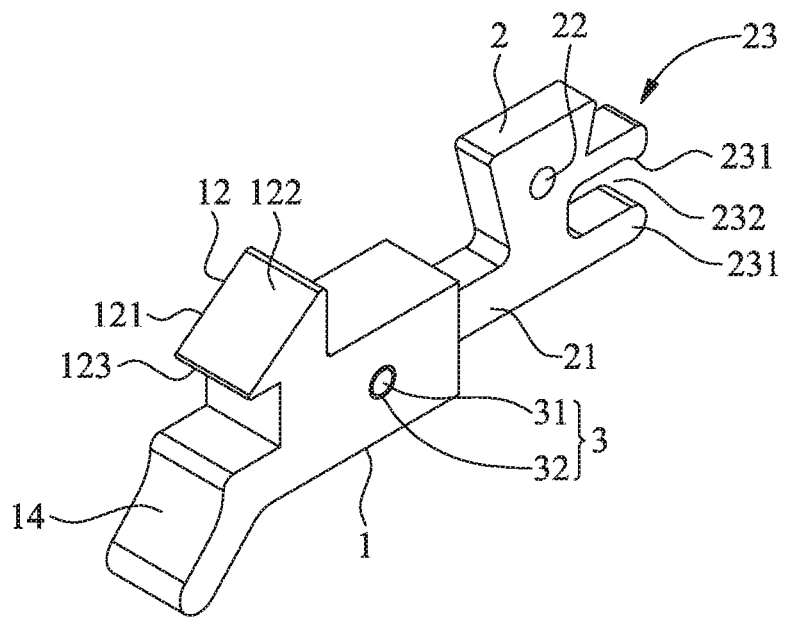
FIG. 6 is an assembled perspective view of a second variant of the first preferred embodiment of the present invention.
Figure 7:
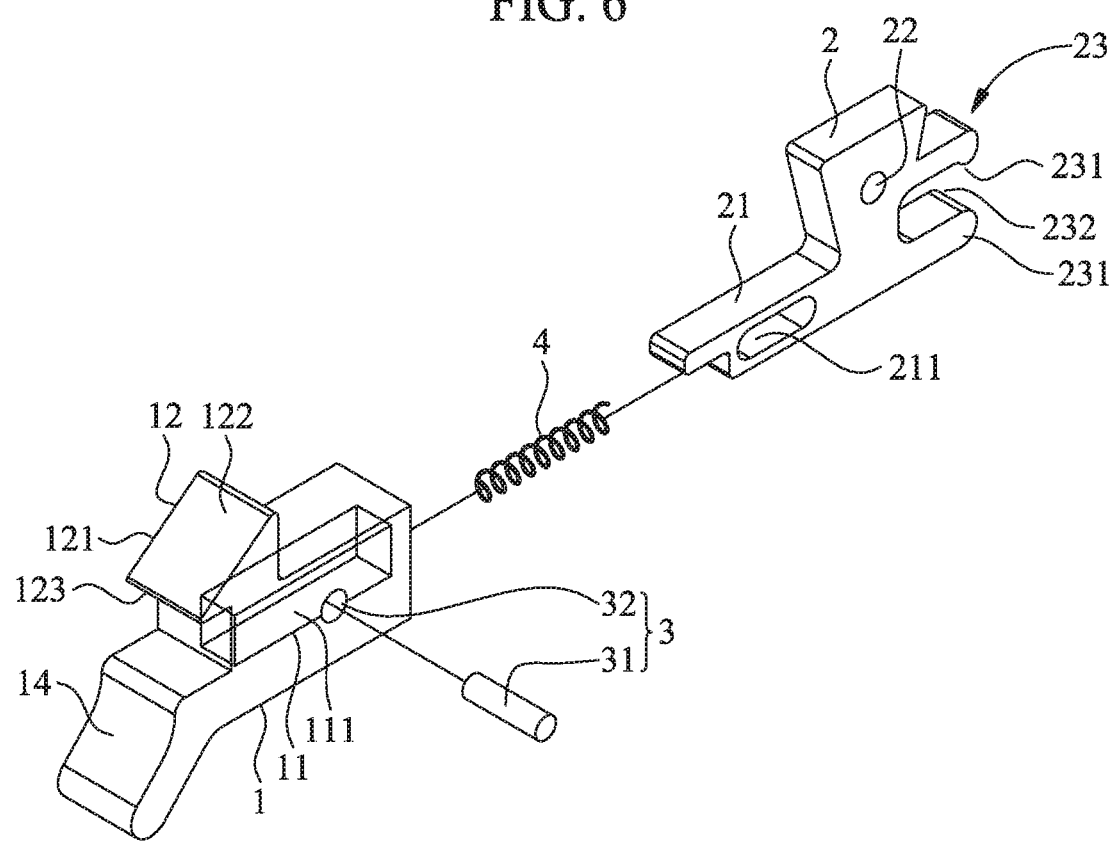
FIG. 7 is an exploded view of FIG. 6.
Figure 8:
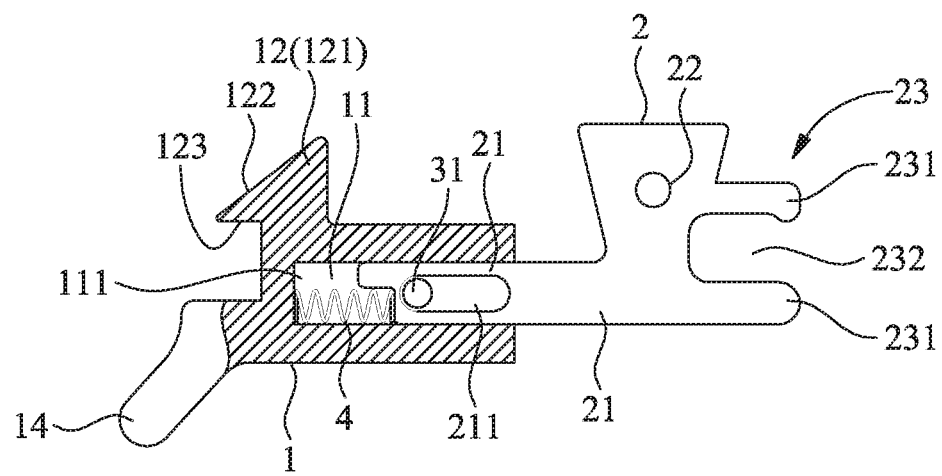
FIG. 8 is a partially sectioned front view of FIG. 6.
Figure 9:
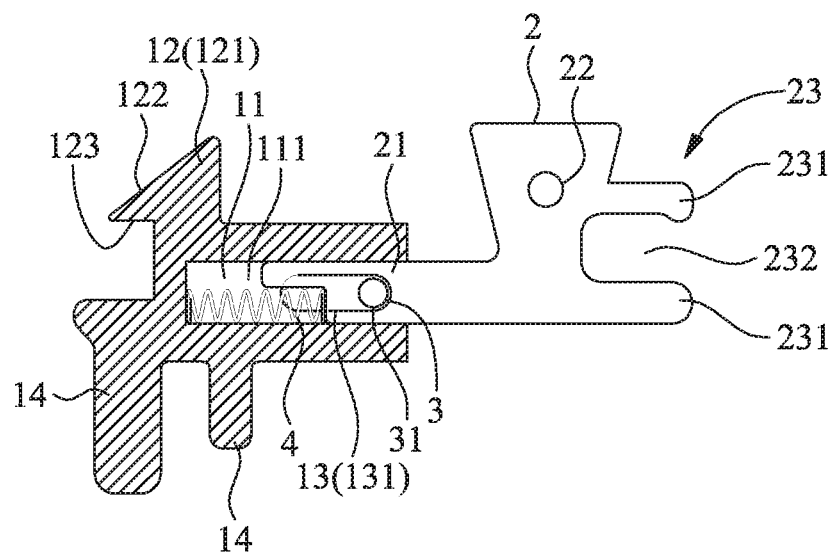
FIG. 9 is a partially sectioned front view of a third variant of the first preferred embodiment of the present invention, showing two first push sections are included in the quick release connecting device.

Please refer to FIGS. 1 to 4, in which the quick release connecting device according to the first preferred embodiment of the present invention is shown. As shown, in the first preferred embodiment, the actuating retainer 1 and the fixing member 2 are held to each other via the pin connection means 3 to allow limited sliding of them relative to each other, and accordingly, the retaining section 12 is slidably engaged with or released from the first object 5. More specifically, the actuating retainer 1 is internally provided with a pin connection slot 13, which communicates with the receiving space 11, and the pin connection means 3 is located in the pin connection slot 13. The pin connection slot 13 can be a long slide slot 131 formed on one or two lateral walls of the receiving space 11. When the pin connection means 3 slides in the long slide slot 131, the actuating retainer 1 and the fixing member 2 are brought to slide relative to each other within a limited range. FIGS. 6 to 8 show a second variant of the quick release connecting device according to the first preferred embodiment of the present invention. In the second variant, the body portion 21 of the fixing member 2 is formed with a long slide hole 211, which is communicable with the receiving space 11, and the pin connection means 3 is slidable in the long slide hole 211 to thereby bring the actuating retainer 1 and the fixing member 2 to slide relative to each other within a limited range.

Please refer to FIGS. 10 to 12, in which the quick release connecting device according to the second preferred embodiment of the present invention is shown. As shown, in the second preferred embodiment, the actuating retainer 1 and the fixing member 2 are held to each other via the pin connection means 3 to allow limited rotating of them relative to each other, and accordingly, the retaining section 12 is rotatably engaged with or released from the first object 5. More specifically, the actuating retainer 1 is also internally provided with a pin connection slot 13, which communicates with the receiving space 11, and the pin connection means 3 is located in the pin connection slot 13. According to an operable embodiment, the pin connection slot 13 can be a locating hole 132 formed on one or two lateral walls of the receiving space 11. When the pin connection means 3 rotates in the locating hole 132, the actuating retainer 1 and the fixing member 2 are brought to rotate relative to each other within a limited angle.

Figure 2:
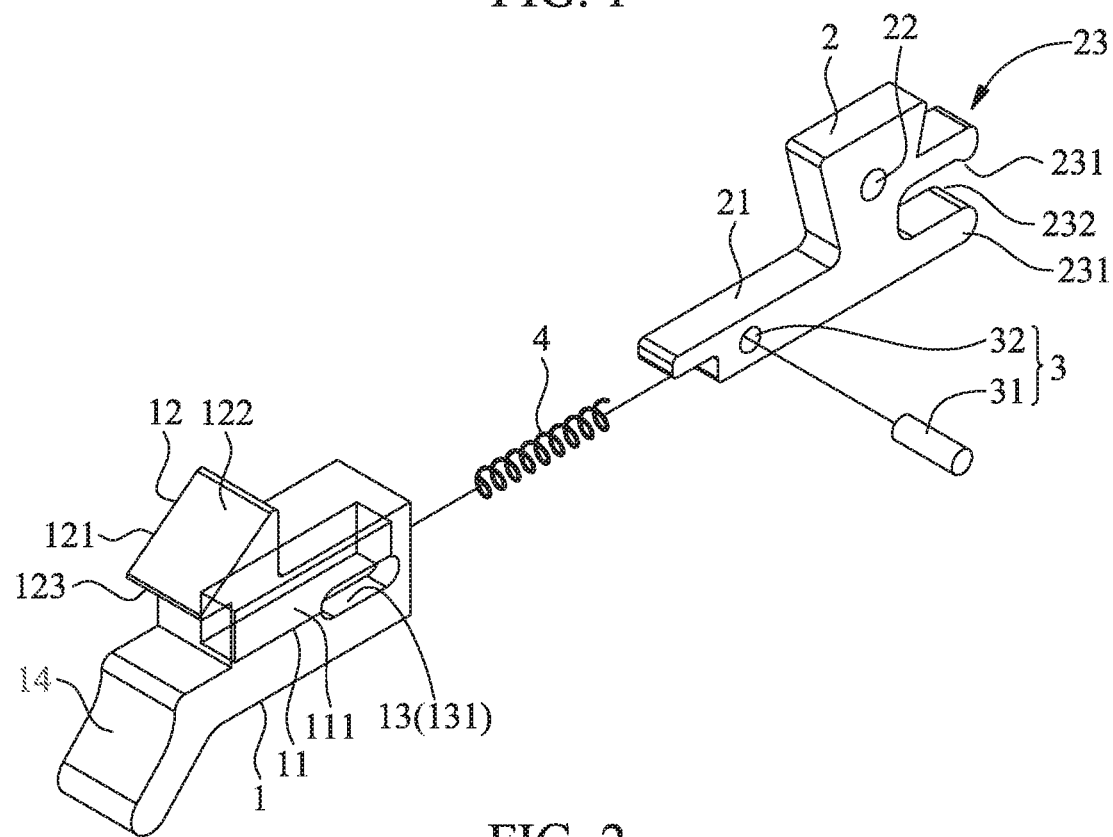
FIG. 2 is an exploded view of FIG. 1.
Figure 3:
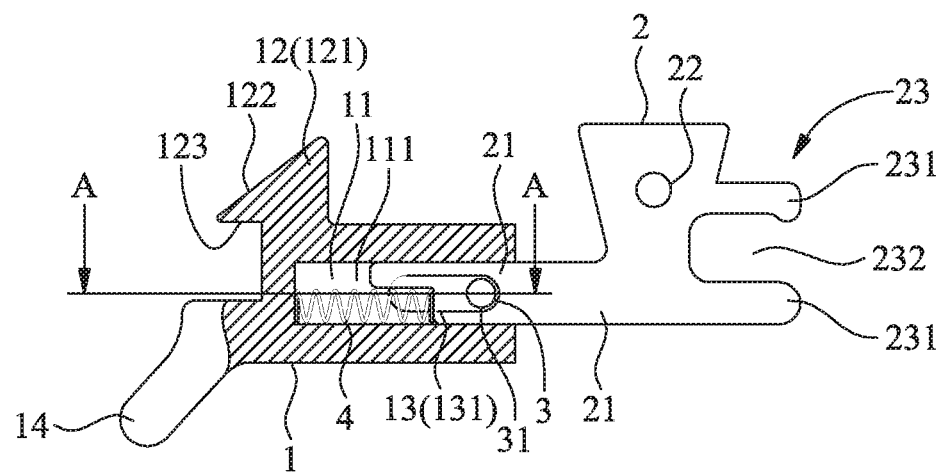
FIG. 3 is a partially sectioned front view of FIG. 1.
Figure 4:
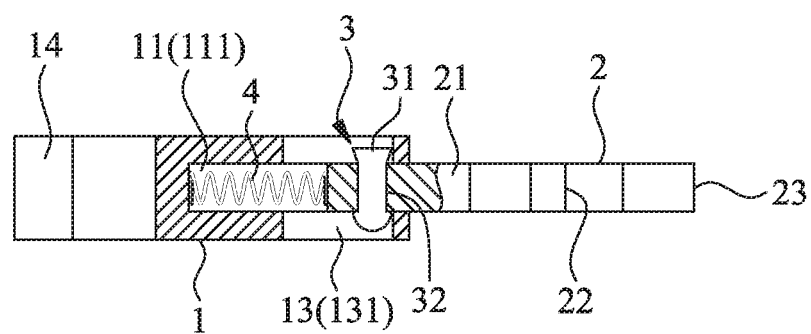
FIG. 4 is a sectional view taken along line A-A of FIG. 3.

In the first preferred embodiment, as can be seen in FIGS. 2 and 4, and in the second preferred embodiment, as can be seen in FIGS. 10 and 12, the pin connection means 3 can include a cylindrical pin 31 integrally formed with or additionally assembled to the body portion 21 of the fixing member 2, and a pin holding hole 32 formed on the body portion 21 of the fixing member 2. The cylindrical pin 31 is inserted in, snapped fitted in, riveted to, expansion-fitted in, glued to or screwed into the pin holding hole 32. Alternatively, the pin connection means 3 can include a cylindrical pin 31 integrally formed with or additionally assembled to the actuating retainer 1, and a pin holding hole 32 formed on the body portion 21 of the fixing member 2. Similarly, the cylindrical pin 31 is inserted in, snapped fitted in, riveted to, expansion-fitted in, glued to or screwed into the pin holding hole 32. By transversely and slidably setting the cylindrical pin 31 of the pin connection means 3 in the long slide slot 131 as in the first preferred embodiment, or by transversely and rotatably setting the cylindrical pin 31 of the pin connection means 3 in the locating hole 132 as in the second preferred embodiment, it is able to achieve the limited sliding or the limited rotation, respectively, of the actuating retainer 1 and the fixing member 2 relative to each other. Alternatively, in the second variant of the first preferred embodiment as shown in FIG. 6, the pin connection means 3 includes a cylindrical pin 31 integrally formed with or additionally assembled to the actuating retainer 1 to transversely extend through the receiving space 11, and at least one pin holding hole 32 preferably formed on the actuating retainer 1 to communicate with the receiving space 11. Again, the cylindrical pin 31 is inserted in, snapped fitted in, riveted to, expansion-fitted in, glued to or screwed into the pin holding hole 32.

Please refer to FIGS. 1 to 12. In both of the first and the second preferred embodiment, the retaining section 12 on the actuating retainer 1 can be a hook 121 directed leftward (see FIGS. 1-11) or rightward (see FIG. 12) when viewing in front of the drawings. The hook 121 is preferably a triangular or wedge shaped hook protruded from the actuating retainer 1, and it includes a beveled guide surface 122 and a hooking surface 123 connected to a lower edge of the beveled guide surface 122. As can be seen in FIG. 13A, the beveled guide surface 122 allows the actuating retainer 1 to be conveniently pressed into the first object 5, and the hooking surface 123 can firmly abut on an inner side of the first object 5 after the beveled guide surface 122 has been moved into the first object 5.

In the first preferred embodiment shown in FIGS. 1 to 9, the fixing member 2 preferably includes at least one second push section 23. As illustrated in the drawings, the second push section 23 can be lying U-shaped to include two jaws 231 formed on an outer end thereof and a holding cavity 232 defined between the two jaws 231. Referring to FIG. 13A, the two jaws 231 and the holding cavity 232 of the second push section 23 can be used to hold the first object 5 thereto. When it is desired to release the second object 6 from the first object 5, simply turn the quick release connecting device as a lever to push the first object 5 out of the second push section 23, and the second object 6 can be easily released from the first object 5.

In the first preferred embodiment shown in FIGS. 1 to 9, the pivot portion 22 of the fixing member 2 is preferably a protruded block, a retaining block or a through hole integrally formed with or additionally assembled to the body portion 21. As shown in FIG. 13A, the quick release connecting device of the present invention can be movably connected to the second object 6 via the protruded block, the retaining block or the through hole. Preferably, the pivot portion 22 can be inserted in, snapped fitted onto, riveted to, expansion-fitted onto or screwed to the second object 6, so that the quick release connecting device and the second object 6 are rotatably connected to each other.

In the first preferred embodiment shown in FIGS. 1 to 9, the receiving space 11 in the actuating retainer 1 includes a straight and rectangular-sectioned slide space 111. The inner end of the body portion 21 of the fixing member 2 is extended into the slide space 111 and is slidably held therein via the pin connection means 3, so that the actuating retainer 1 and the fixing member 2 are able to slide relative to each other within a limited range. The elastic element 4 is preferably a coil spring, as shown in FIGS. 2 to 6, but it can also be an elastic plate or an elastic bar. The elastic element 4 is disposed in the slide space 111 with an end pressed against an inner wall surface of the slide space 111 and another end pressed against the body portion 21, such that the actuating retainer 1 and the fixing member 2 can slide relative to each other within a limited range and then return to their respective original position under the elastic force of the elastic element 4.

In the second preferred embodiment shown in FIGS. 10 to 12, the receiving space 11 in the actuating retainer 1 includes an arcuate slide space 112. The inner end of the body portion 21 of the fixing member 2 is extended into the arcuate slide space 112 and is rotatably held therein via the pin connection means 3, so that the actuating retainer 1 and the fixing member 2 are able to rotate relative to each other within a limited angle. The elastic element 4 is preferably a coil spring, as shown in FIG. 10, but it can also be an elastic plate as shown in FIG. 12 or an elastic bar (not shown). The elastic element 4 is disposed in the arcuate slide space 112 with an end pressed against an inner wall surface of the slide space 112 and another end pressed against the body portion 21, such that the actuating retainer 1 and the fixing member 2 can rotate relative to each other within a limited angle and then return to their respective original position under the elastic force of the elastic element 4.

Figure 13C:
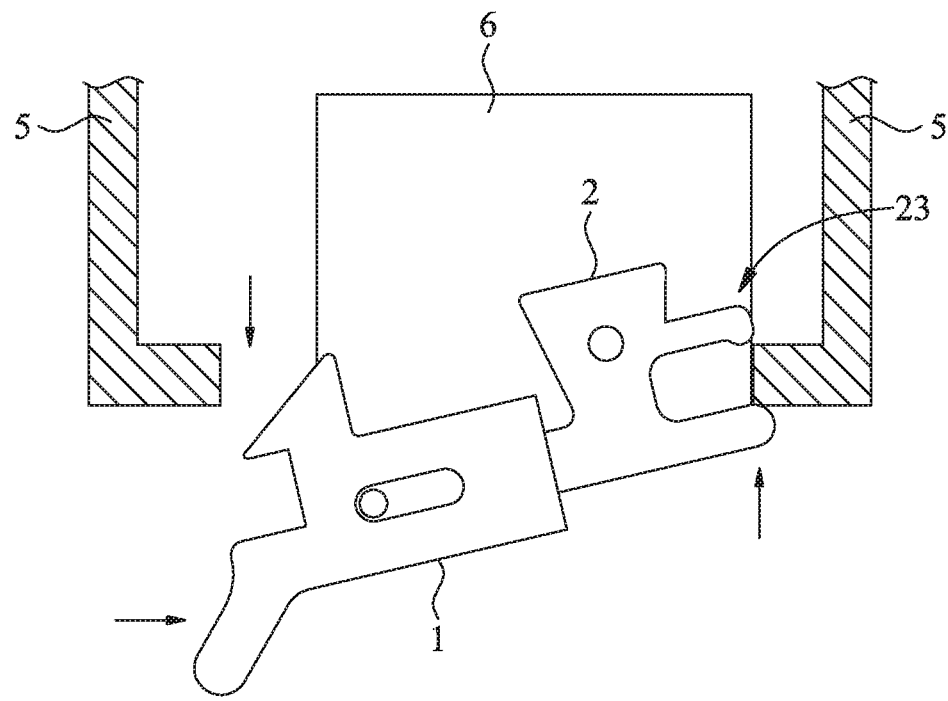
FIG. 13C shows the quick release connecting device according to the first preferred embodiment of the present invention is connected to two objects and can be operated to quickly release the two objects from each other.
Figure 13D:
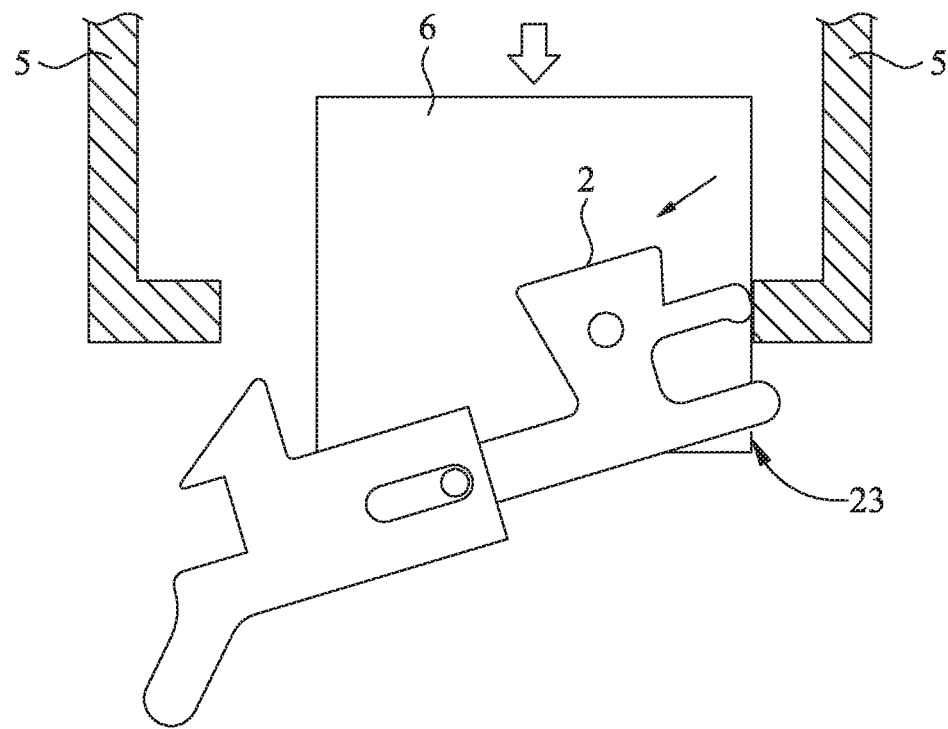
FIG. 13D shows the quick release connecting device according to the first preferred embodiment of the present invention is connected to two objects and can be operated to quickly release the two objects from each other.

The first object 5 can be a rack, a chassis, a cabinet for drawers, a window frame or other objects; and the second object 6 can be a circuit board, a drawer, a window or other objects. FIG. 13A shows the quick release connecting device according to the first preferred embodiment of the present invention is movably assembled to the second object 6 via the pivot portion 22 of the fixing member 2. Meanwhile, the retaining section 12 of the actuating retainer 1 and the second push section 23 of the fixing member 2 are detachably engaged with two opposite sides of the first object 5, so that the second object 6 is located in and sidewardly movably connected to the first object 5 via the quick release connecting device. When it is desired to separate the second object 6 from the first object 5, as indicated by FIG. 13B, simply push the first push section 14 of the actuating retainer 1 with one hand, so that the actuating retainer 1 slides toward the fixing member 2 by a limited range to separate the retaining section 12 from one side of the first object 5. Then, as shown in FIG. 13C, utilize the principle of leverage to push the quick release connecting device for the fixing member 2 to rotate about the pivot portion 22, bringing the second push section 23 to push the other side of the first object 5 away from it. At this point, the second object 6 can be pulled to slide out of the first object 5. Finally, as shown in FIG. 13D, when the second object 6 is separated from the first object 5 and the first push section 14 is no longer subjected to a push, the elastic element 4 automatically pushes the actuating retainer 1 to slide relative to the fixing member 5 back to its original position.

Figure 14A:
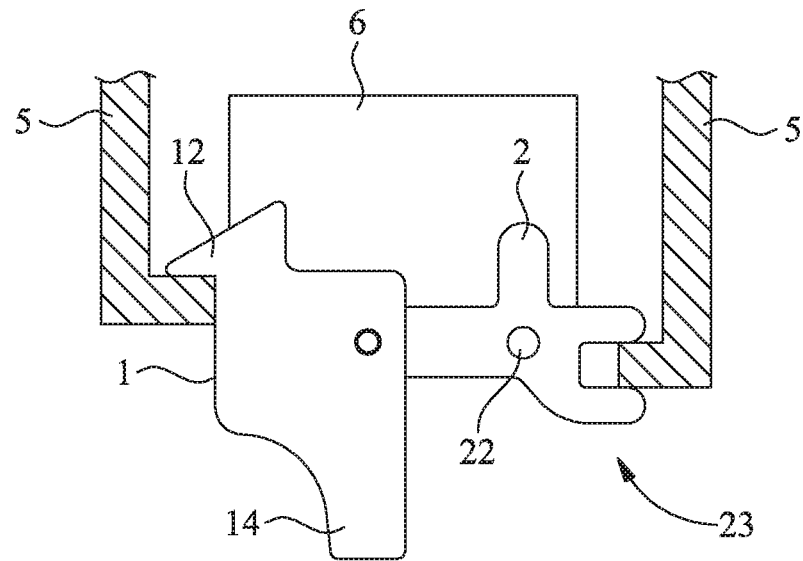
FIG. 14A shows the quick release connecting device according to the second preferred embodiment of the present invention is connected to two objects and can be operated to quickly release the two objects from each other.
Figure 14B:
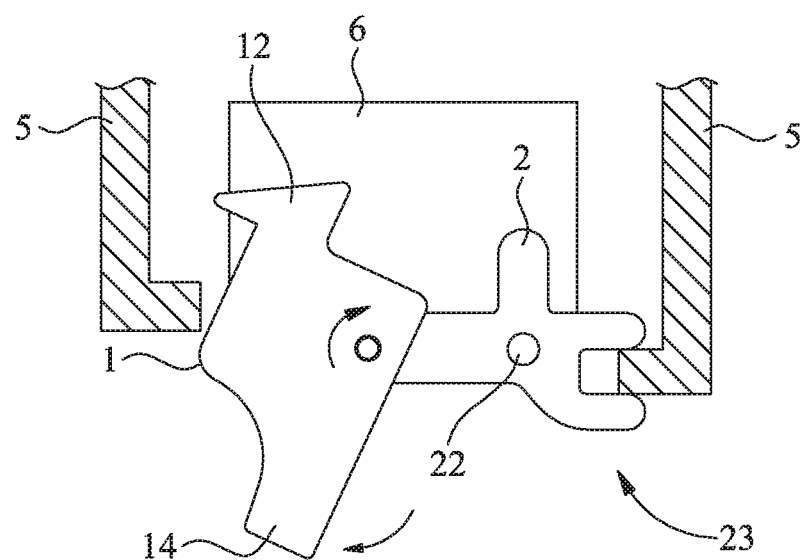
FIG. 14B shows the quick release connecting device according to the second preferred embodiment of the present invention is connected to two objects and can be operated to quickly release the two objects from each other.
Figure 14C:
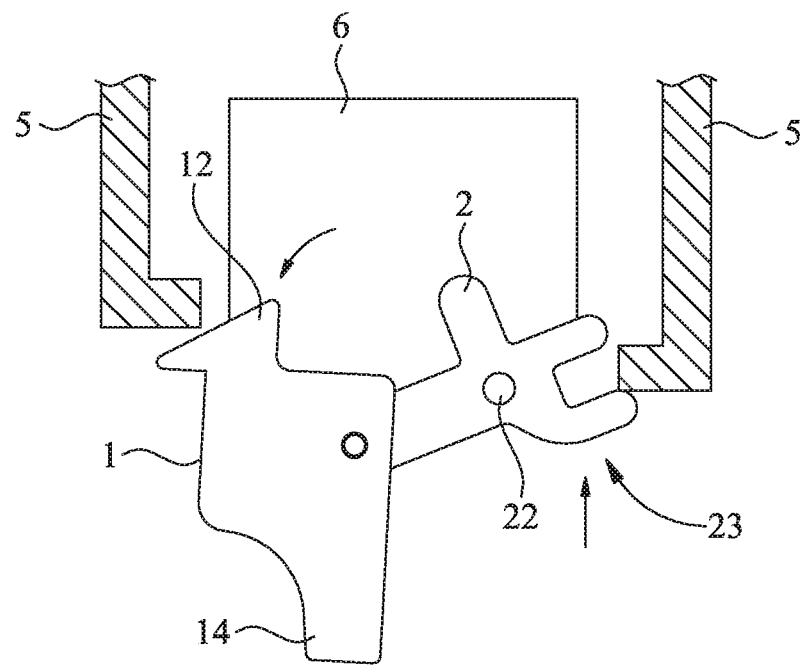
FIG. 14C shows the quick release connecting device according to the second preferred embodiment of the present invention is connected to two objects and can be operated to quickly release the two objects from each other.
Figure 14D:
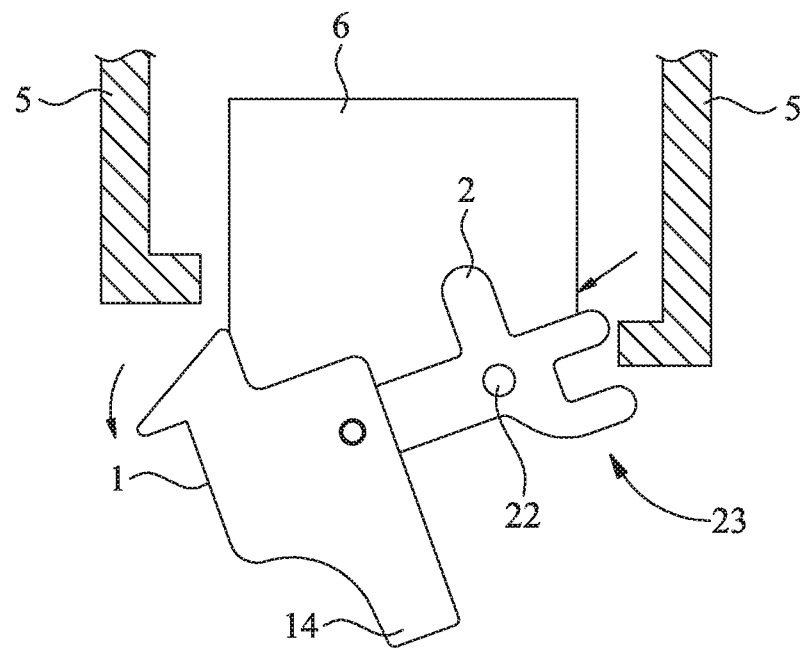
FIG. 14D shows the quick release connecting device according to the second preferred embodiment of the present invention is connected to two objects and can be operated to quickly release the two objects from each other.

FIG. 14A shows the quick release connecting device according to the second preferred embodiment of the present invention is similarly movably assembled to the second object 6 via the pivot portion 22 of the fixing member 2. Meanwhile, the retaining section 12 of the actuating retainer 1 and the second push section 23 of the fixing member 2 are detachably engaged with two opposite sides of the first object 5, so that the second object 6 is located in and sidewardly movably connected to the first object 5 via the quick release connecting device. When it is desired to separate the second object 6 from the first object 5, as indicated by FIG. 14B, simply push the first push section 14 of the actuating retainer 1 with one hand, so that the actuating retainer 1 rotates relative to the fixing member 2 by a limited angle to separate the retaining section 12 from one side of the first object 5. Then, as shown in FIG. 14C, utilize the principle of leverage to push the quick release connecting device for the fixing member 2 to rotate about the pivot portion 22, bringing the second push section 23 to push the other side of the first object 5 away from it. At this point, the second object 6 can be pulled to slide out of the first object 5. Finally, as shown in FIG. 14D, when the second object 6 is separated from the first object 5 and the first push section 14 is no longer subjected to a push, the elastic element 4 automatically pushes the actuating retainer 1 to rotate relative to the fixing member 5 back to its original position.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A quick release connecting device for releasably securing a circuit board within an interior cavity of a rack or chassis, the interior cavity having an opening defined between opposing first and second sidewalls through which the circuit board is removably inserted, the connecting device comprising:

an actuating retainer including a first push section protruding from a first end thereof and a retaining section protruding from a second end thereof for detachably engaging with the first sidewall of the rack or chassis, the retaining section having an engagement surface which faces the first end of the actuating retainer and engages an inner surface of the first sidewall in a latched position of the connecting device, and a central body portion of the actuating retainer comprising a receiving space defined therein;

a fixing member including a central body portion extending through an opening of the receiving space of the actuating retainer and having a pin connection means pivotably connecting the fixing member to the actuating retainer, an inner end of the fixing member being pivotably received within the receiving space, and the fixing member comprising a pivot portion formed on an outer end thereof located outside the receiving space and having a through hole pivotably receiving a fastener for detachably connecting with the circuit board, the Divot portion comprising a second push section protruding from a distal end thereof for detachably engaging with the second sidewall of the rack or chassis, the second push section comprising a holding cavity defining opposing engagement surfaces for engaging inner and outer surfaces of the second sidewall in the latched position of the connecting device; and an arc-shaped elastic element disposed in the receiving space of the actuating retainer with an end directly pressed against an inner wall surface of the receiving space and another opposite end against the inner end of the fixing member, the elastic element biasing the fixing member to rotate relative to the actuating retainer about the pin connection means to the latched position;

wherein, to move the connecting device from the latched position to an unlatched position to remove the circuit board from the rack or chassis, the first push section is pushed outwardly toward the first sidewall to rotate the actuating retainer relative to the fixing member to separate the retaining section from the inner surface of the first sidewall, and the actuating retainer and the fixing member are subsequently rotated about the pivot portion fastener outwardly from the opening of the rack or chassis such that the second push section disengages from the inner surface of the second sidewall and pushes against the outer surface of the second sidewall to separate the circuit board from the rack or chassis.

\* \* \* \* \*